United States Patent
Buck et al.

(10) Patent No.: US 6,833,775 B2
(45) Date of Patent: Dec. 21, 2004

(54) MICROWAVE CIRCUIT

(75) Inventors: Christopher M. Buck, Stockport (GB); Keith R. Williams, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/114,498

(22) Filed: Apr. 2, 2002

(65) Prior Publication Data

US 2002/0180567 A1 Dec. 5, 2002

(30) Foreign Application Priority Data

Apr. 6, 2001 (GB) .............................................. 0108655

(51) Int. Cl.$^7$ .............................................. H01P 1/203
(52) U.S. Cl. .................................... 333/204; 333/245
(58) Field of Search ................................ 333/204, 245, 333/246, 247, 128; 343/700 MS; 257/728, 758

(56) References Cited

U.S. PATENT DOCUMENTS

| | | | | |
|---|---|---|---|---|
| 3,638,148 A | * | 1/1972 | Hallford et al. | ............ 333/246 |
| 3,959,749 A | | 5/1976 | Ikushima et al. | ............. 333/73 |
| 5,202,752 A | * | 4/1993 | Honjo | ......................... 257/678 |
| 5,569,879 A | * | 10/1996 | Gloton et al. | ............... 174/52.2 |
| 6,057,600 A | * | 5/2000 | Kitazawa et al. | ........... 257/728 |
| 6,060,967 A | * | 5/2000 | Asada | ......................... 333/202 |
| 6,525,623 B2 | * | 2/2003 | Sridharan et al. | ........... 333/128 |

FOREIGN PATENT DOCUMENTS

| GB | 2297652 A | 1/1996 | ............ H05K/1/18 |
|---|---|---|---|
| JP | 05-259720 | * 8/1993 | |

OTHER PUBLICATIONS

Patent Abstracts of Japan, vol. 2000, No. 03, May 3, 2000, JP11340709.

* cited by examiner

Primary Examiner—Linh My Nguyen
(74) Attorney, Agent, or Firm—Michael E. Belk

(57) ABSTRACT

A microwave circuit comprises a printed circuit board (PCB) on which is fabricated a circuit including passive components such as filters (40) formed by printed conductive patterns. In order to enhance the performance of the circuit, selected components such as filters are made with a greater precision on substrate material (41), such as alumina, having a higher dielectric constant than that of the printed circuit board material. The finished component is mounted on the printed circuit board and the conductive pattern is connected by wire bonds (48, 50) to microstrip tracks (51) of the printed circuit board.

16 Claims, 2 Drawing Sheets

MICROWAVE CIRCUIT

The present invention relates to a microwave circuit and has particular, but not exclusive, application to a circuit fabricated on an RF printed circuit board (PCB).

Typically microwave circuits such as frequency converters for converting L-band to RF or RF to L-band include passive components such as filters. For convenience it is desirable if the filter could be defined as a pattern in the metal layer of the PCB. However, currently used commercial PCB patterning techniques are only able to define circuit tracks with 150 $\mu$m gaps and track widths to a precision of ±20 $\mu$m. This level of precision is too coarse to be able to define a filter having the performance required.

It is an object of the present invention to provide a microwave circuit having a desired performance on a PCB and in a cost effective manner.

According to one aspect of the present invention there is provided a microwave circuit comprising a printed circuit board consisting of a substrate having a metal backing on one surface of the substrate and at least one microstrip track on another surface thereof, and at least one sub-circuit mounted on the printed circuit board, the sub-circuit comprising a substrate having a higher dielectric constant than that of the printed circuit board substrate and having a conductive pattern thereon, the conductive pattern being coupled electrically to the at least one microstrip track.

According to another aspect of the present invention there is provided a microwave circuit comprising a printed circuit board on which is fabricated an RF stage having a frequency up-converter having an RF output coupled to a local oscillator reject filter and an image reject filter coupled to an RF input of a frequency down-converter, wherein the local oscillator reject filter and the image reject filter respectively comprise a sub-circuit comprising a substrate having a higher dielectric constant than that of the printed circuit board substrate and having a printed conductive pattern thereon, the conductive pattern being coupled electrically to the at least one microstrip track provided on the printed circuit board.

By virtue of the substrate having a higher dielectric constant than that of the printed circuit board, the sub-circuit can be physically smaller compared to a similar circuit made in PCB material. In an embodiment of the microwave circuit, the dielectric substrate comprises alumina which has a dielectric constant $\epsilon_r$=9.9 compared to an $\epsilon_r$=2.2 for the PCB material. The higher dielectric constant enables the sub-circuit on alumina to be half the size of that on the PCB material. The patterning technique can be done in a technology which is capable of achieving the required definition accuracy and which enables many hundreds of sub-circuits to be made simultaneously. Thus the method in accordance with the present invention enables two different technologies to be combined with a beneficial performance gain and cost effectiveness.

The present invention will now be described, by way of example, with reference to the accompanying drawings, wherein.

Figure 2:
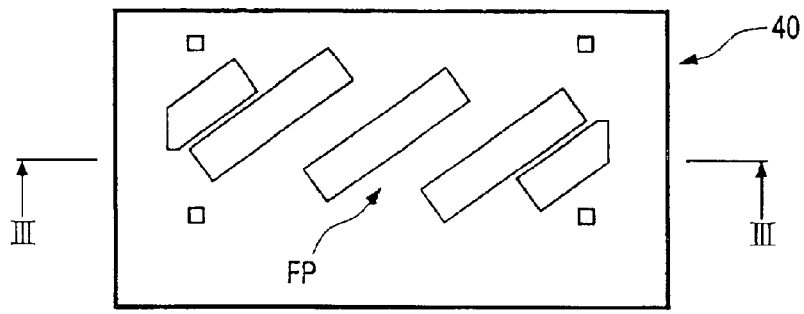
FIG. 2 is a plan view of an example of a drop-in filter.
Figure 3:
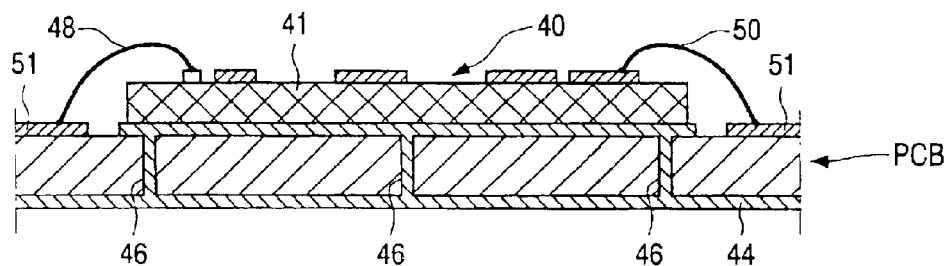
Figure 4:
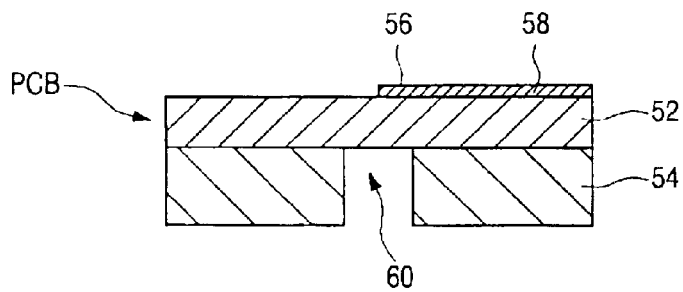
Figure 5:
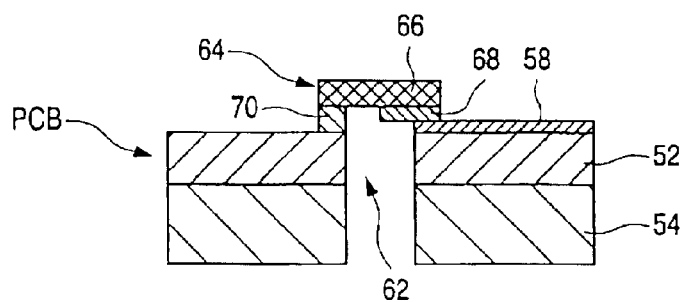

FIG. 3 is a diagrammatic cross-sectional view of a portion of a circuit board having a drop-in filter, the filter being shown in cross-section on the line III—III of FIG. 2, FIG. 4 is a diagrammatic cross-sectional view through a PCB showing a conventional method of coupling a microstrip track to an output device, such as an antenna, and FIG. 5 is a diagrammatic cross-sectional view through a PCB showing an embodiment of a coupling arrangement using a sub-circuit.

In the drawings the same reference numerals have been used to represent corresponding features.

Figure 1:
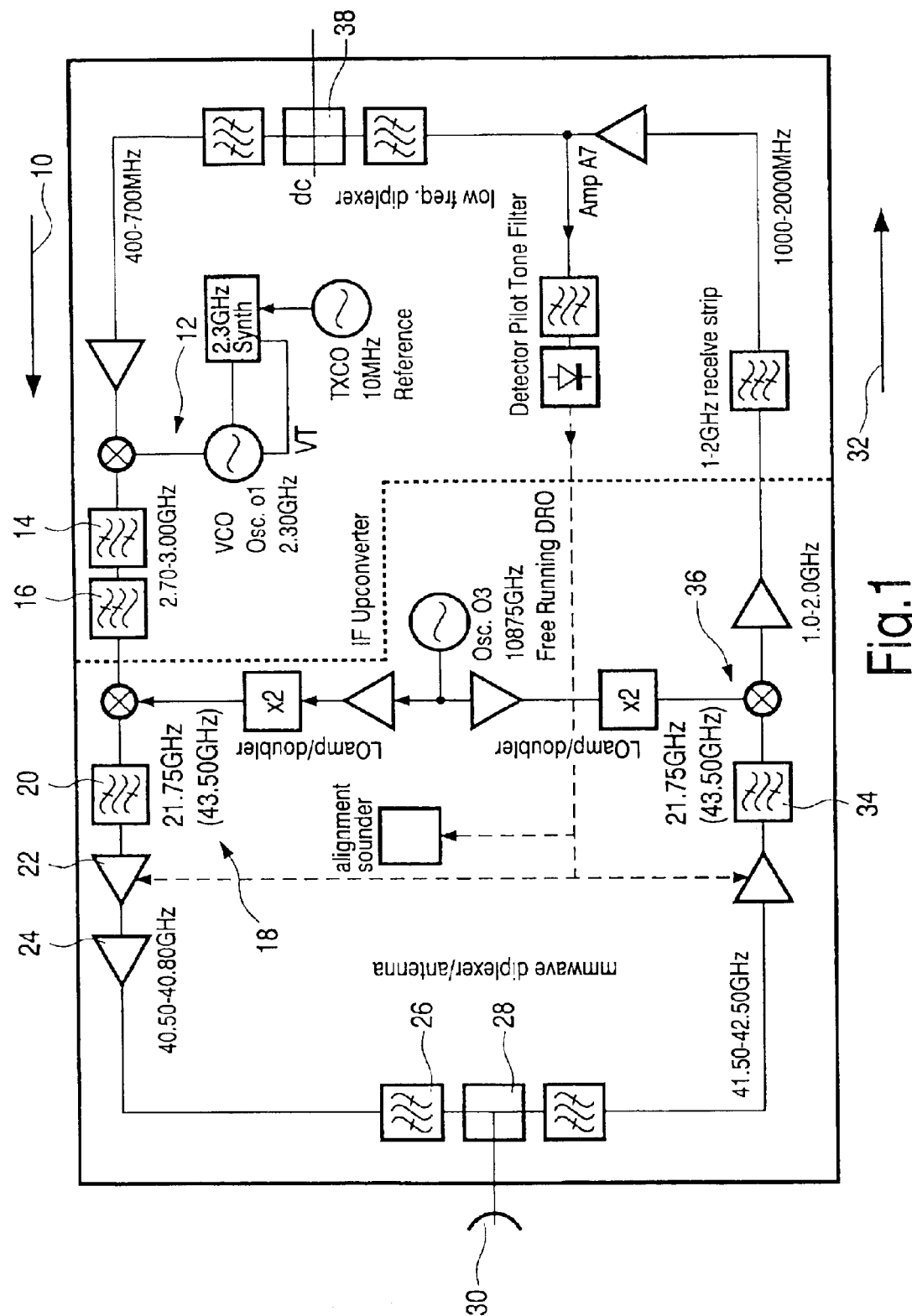
FIG. 1 is a block schematic diagram of a two-way L-band to RF circuit board.

FIG. 1 shows a two-way L-band to RF and vice versa circuit capable of operating in the mm-wave range of say 23 GHz to 42.5 GHz. An upstream path 10 includes a first frequency up-converter 12, an output from which is filtered in a bandpass filter 14 and then in a low pass filter 16. An output of the filter 16 is applied to a second frequency up-converter 18. A local oscillator reject filter 20 is coupled to an output of the second frequency up-converter 18, the output from which is amplified in amplifiers 22, 24 and filtered in a bandpass filter 26, before being applied to an antenna 30 by way of a mm-wave diplexer 28.

A downstream path 32 includes an image reject bandpass filter 34 which is coupled to a frequency down-conversion stage 36. An output from the frequency down-conversion stage 36 is filtered and amplified prior to being applied to a low frequency diplexer 38. The diplexer 38 is also connected to an input of the first frequency up-converter 12.

The local oscillator reject filter 20 and the image reject filter 34 comprise what is termed drop-in filters which are passive filters made separately from a printed circuit board on which other components are fabricated. The drop-in filters are made using a technology capable of achieving a filter pattern to the required degree of accuracy which is more precise than that used in commercial PCB patterning techniques in current use.

FIGS. 2 and 3 illustrate a plan view of a drop-in filter 40 and a diagrammatic cross sectional view of the drop-in filter 40 mounted on a PCB, respectively. The filter 40 is made on an alumina substrate 41 whose dielectric constant, $\epsilon_r$=9.9, is sufficiently high to allow the drop-in filter to be small, typically a 3-pole filter designed for frequencies of at about 26 GHz occupies an area of 2.5 mm×5 mm. Many hundreds of filters can be manufactured on the same alumina substrate.

The drop-in filter 40 is a passive filter formed by a printed filter pattern FP on one surface of the alumina substrate 41 and a microwave ground electrode 42 on the opposite surface. This ground electrode 42 is electrically coupled to a microwave ground 44 on the PCB by way of viaholes 46. Wire bonds 48, 50 connect the printed filter pattern to the conductive tracks 51 of the PCB.

Thus by being able to interchange the drop-in filters, the same low cost substrate PCB can be configured for different applications and different frequencies of operation. The microwave circuits are cost effective because the costlier processing is carried-out on those parts which require a higher performance.

In another application in which microstrip tracks on a PCB are coupled to an antenna, waveguide probes are conventionally printed onto the PCB at locations where the microstrip track extends into the waveguide. Referring to FIG. 4 which shows diagrammatically a conventional coupling method for high frequency applications, the PCB 52 is a thin substrate which can be supported with a metal backing 54. A waveguide probe 56 comprises a terminal portion of a PCB track 58. To maximise the efficiency of this coupling arrangement, a backshort (not shown) is placed at an appropriate distance behind the probe 56. The backshort is a piece of closed-off waveguide, typically $\lambda$/4 long, which is actually formed in another piece of metal, such as a lid to a circuit, and is pressed up against the probe 56. The thicknesses of the metal backing 54 and the PCB substrate 52 lie between the backshort and the probe 56.

In order to expose the probe 56 to the backshort, the metal backing 54 must be removed selectively without damaging the probe 56 itself. The milling of a typically rectangular hole 60 in the metal backing 54 is a relatively difficult task and hence is costly.

Referring to FIG. 5 which shows a cost effective arrangement which uses a separately made sub-circuit, a printed circuit board PCB comprises a relatively thin dielectric substrate 52 having an electrically conductive metal backing 54 on one surface and at least one PCB track 58 on the opposite surface. At the intended location of a backshort, a rectangular, through-aperture 62 is made by milling through the thickness of the metal backing 54, the substrate 52 and, if present, the terminal end of the PCB track 58 A separate probe 64 is provided as a sub-circuit. The probe 64 comprises an elemental piece of an alumina substrate 66 having a length greater than the cross-sectional dimension of the through-aperture 62 and a conductive track 66 printed on the substrate 64 for substantially half its length. The probe 68 is disposed over the through-aperture 62 with the terminal end of the conductive track 68 disposed over the centre of the through-aperture 62 and the other end in electrical contact with the PCB track 58. A conductive epoxy resin is used to effect a permanent electrical contact between the other end of the conductive track 68 and the PCB track 58.

The same resin may be used to form a supporting pad 70 to hold the opposite end of the sub-circuit in position on the PCB substrate 52.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of microwave PCBs and component parts therefor and which may be used instead of or in addition to features already described herein.

What is claimed is:

1. A microwave circuit assembly comprising a printed circuit board with a substrate having a metal backing on one surface of the substrate and at least one microstrip track on another surface thereof, and at least one sub-circuit mounted on the printed circuit board, the sub-circuit including a substrate having a higher dielectric constant than that of the printed circuit board substrate and having a conductor pattern thereon, the conductor pattern being coupled electrically to the at least one microstrip track.

2. A microwave circuit as claimed in claim 1, characterized in that the sub-circuit substrate comprises alumina.

3. A microwave circuit assembly comprising a printed circuit board with, a substrate having a metal backing on one surface of the substrate and at least one microstrip track on another surface thereof, and at least one sub-circuit mounted on the printed circuit board, the sub-circuit including a substrate having a higher dielectric constant than that of the printed circuit board substrate and having a conductor pattern thereon, the conductor pattern being coupled electrically to the at least one microstrip track wherein the sub-circuit comprises at least one filter fabricated as a separate component and mounted on the printed circuit board.

4. A microwave circuit as claimed in claim 3, in that the at least one filter comprises and alumina substrate having a printed conductive pattern on one surface.

5. A microwave circuit assembly comprising a printed circuit board with a substrate having a metal backing on one surface of the substrate and at least one microstrip track on another surface thereof, and at least one sub-circuit mounted on the printed circuit board, the sub-circuit including a substrate having a higher dielectric constant than that of the printed circuit board substrate and having a conductor pattern thereon, the conductor pattern being coupled electrically to the at least one microstrip track wherein the sub-circuit comprises a probe formed by an electrically conductive track on a portion of the length of a dielectric substrate, and in that the probe is mounted over a through-aperture in the metal backing and the printed circuit substrate with the electrically conductive track electrically connected to the microstrip track and having a terminal end disposed over the through-aperture.

6. A microwave circuit as claimed in claim 5, characterized in that at least the electrically conductive track is bonded to the microstrip track using a conductive epoxy resin.

7. A microwave circuit comprising a printed circuit board on which is fabricated an RF stage having a frequency up-converter having an RF output coupled a local oscillator reject filter and an image reject filter coupled to a RF input of a frequency down-converter, wherein the local oscillator reject filter and the image reject filter respectively comprise a sub-circuit comprising a substrate having a higher dielectric constant than that of the printed circuit board substrate and having a printed conductive pattern thereon, the conductor pattern being coupled electrically to at least one microstrip track provided on the printed circuit board.

8. A microwave circuit as claimed in claim 7, characterized in that the sub-circuit substrate comprises alumina.

9. A microwave circuit as claimed in claim 7, characterized in that the sub-circuit further comprises a separate circuit board mounted on the printed circuit board.

10. A microwave circuit of claim 1, wherein the dielectric constant of the sub-circuit is at least four times greater than the dielectric constant of the printed circuit board.

11. A microwave circuit of claim 1, wherein the conductor pattern formed on the sub-circuit has a size substantially half that of equivalent conductor patterns formed in materials having dielectric constants similar to the printed circuit board substrate.

12. A microwave circuit of claim 1, further comprising the sub-circuit having the conductor pattern formed on a first side and an electrode formed on a second side opposite the first side, where the electrode is coupled to a ground on the printed circuit board.

13. A microwave circuit of claim 1, wherein the conductor pattern on the sub-circuit is coupled to the at least one microstrip track by at least one wire bond.

14. A microwave circuit of claim 1, wherein the dielectric constant of the sub-circuit is at least twice the dielectric constant of the printed circuit board.

15. A microwave circuit of claim 1 further comprising the printed circuit board having a plurality of sub-circuits mounted on the printed circuit board, wherein the conductor pattern of at least two of the sub-circuits is a filter.

16. A microwave circuit of claim 15 wherein the filters are of a size substantially half that for equivalent filters formed in material having a similar dielectric constant to the printed circuit board.

* * * * *